(12) United States Patent
Kolbe et al.

(10) Patent No.: US 9,379,298 B2
(45) Date of Patent: Jun. 28, 2016

(54) LAMINATE SUB-MOUNTS FOR LED SURFACE MOUNT PACKAGE

(71) Applicant: HENKEL IP & HOLDING GMBH, Duesseldorf (DE)

(72) Inventors: Justin Kolbe, Rochester, MN (US); Steve Taylor, Prescott, WI (US)

(73) Assignee: HENKEL IP & HOLDING GMBH, Duesseldorf (DE)

( * ) Notice: Subject to any disclaimer, the term of this patent is extended or adjusted under 35 U.S.C. 154(b) by 0 days.

(21) Appl. No.: 14/505,557

(22) Filed: Oct. 3, 2014

(65) Prior Publication Data

US 2016/0099392 A1    Apr. 7, 2016

(51) Int. Cl.
*H01L 33/48* (2010.01)
*H01L 33/62* (2010.01)
*H01L 33/60* (2010.01)

(52) U.S. Cl.
CPC ............ *H01L 33/62* (2013.01); *H01L 33/486* (2013.01); *H01L 33/60* (2013.01)

(58) Field of Classification Search
CPC .......... H01L 3/60; H01L 3/4863; H01L 3/486
See application file for complete search history.

(56) References Cited

U.S. PATENT DOCUMENTS

| | | | |
|---|---|---|---|
| 6,874,910 B2 | 4/2005 | Sugimoto et al. | |
| 6,885,035 B2 | 4/2005 | Bhat et al. | |
| 7,098,543 B2 | 8/2006 | Lai | |
| 7,723,736 B2 | 5/2010 | Lee et al. | |
| 7,897,990 B2 | 3/2011 | Amoh et al. | |
| 8,319,247 B2 | 11/2012 | Bierhuizen et al. | |
| 8,455,275 B2 | 6/2013 | Hong et al. | |
| 8,598,612 B2 | 12/2013 | Greenwood | |
| 2002/0113246 A1* | 8/2002 | Nagai et al. | 257/99 |
| 2004/0026708 A1 | 2/2004 | Chen | |
| 2006/0124953 A1* | 6/2006 | Negley et al. | 257/99 |
| 2009/0189177 A1* | 7/2009 | Lee et al. | 257/99 |
| 2011/0042699 A1* | 2/2011 | Park et al. | 257/98 |
| 2012/0199862 A1 | 8/2012 | Li et al. | |
| 2012/0326200 A1 | 12/2012 | Shen et al. | |
| 2013/0051073 A1* | 2/2013 | Park | 362/612 |
| 2014/0293554 A1* | 10/2014 | Shashkov | C25D 11/024 361/748 |

FOREIGN PATENT DOCUMENTS

JP    2002094122 A    3/2002
WO    2013186653 A1    12/2013

* cited by examiner

*Primary Examiner* — Yuanda Zhang
*Assistant Examiner* — Michael Carter
(74) *Attorney, Agent, or Firm* — James J. Cummings

(57) ABSTRACT

An LED package is described that acts as a sub-mount between a printed circuit board and an LED. The sub-mount includes a laminate to thermally isolate the LED from the PCB while providing a thermal heat dissipative sink for the LED.

8 Claims, 4 Drawing Sheets

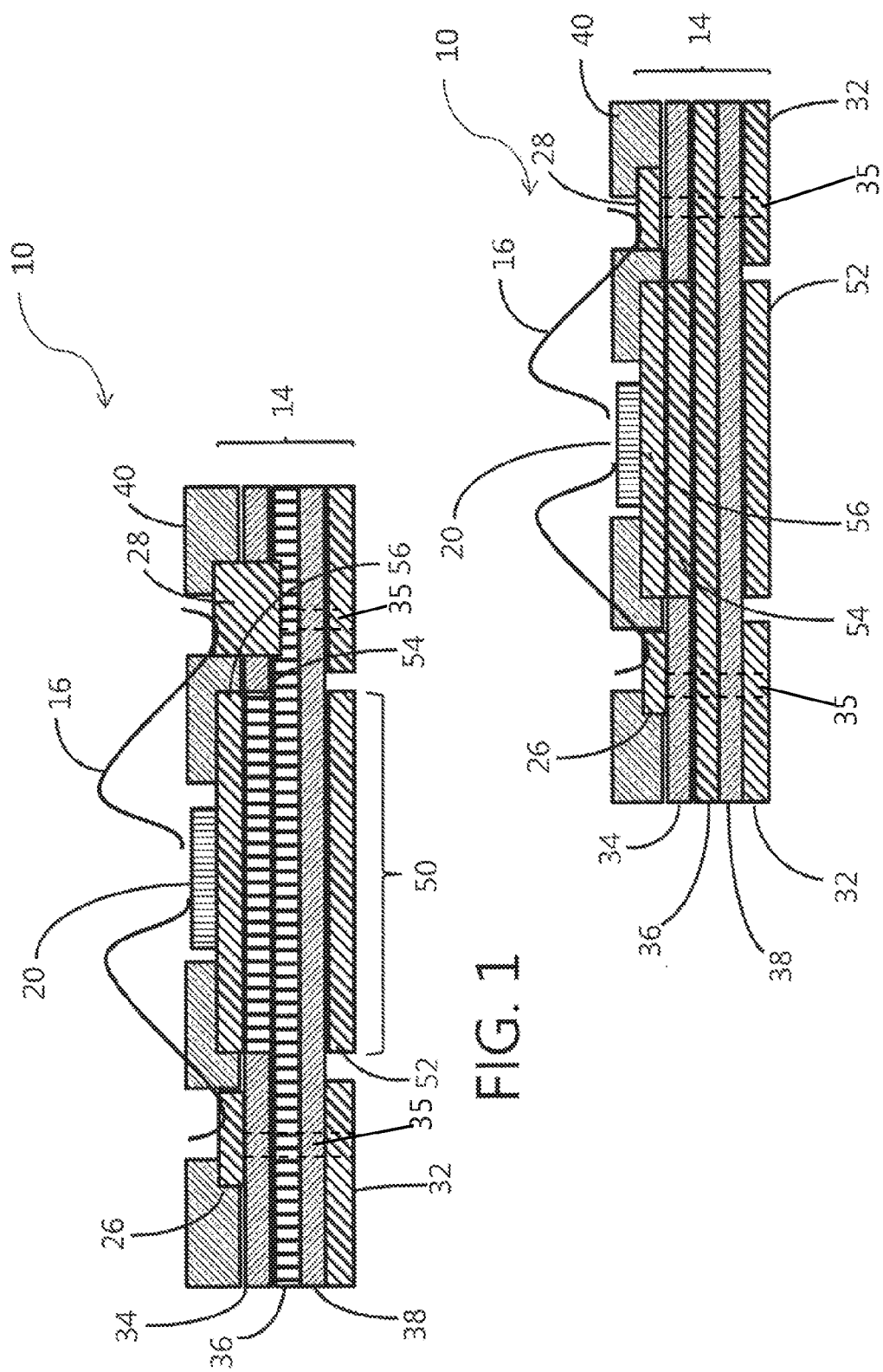

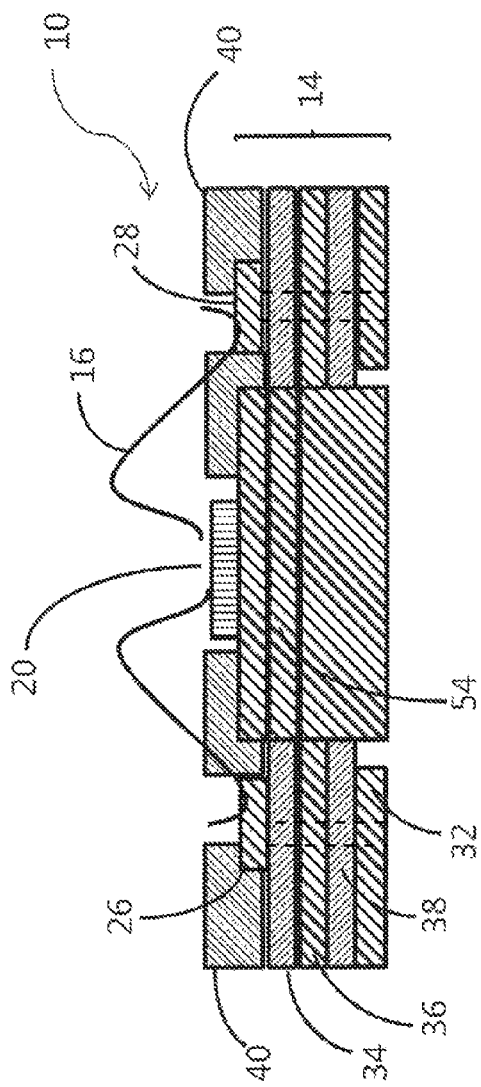
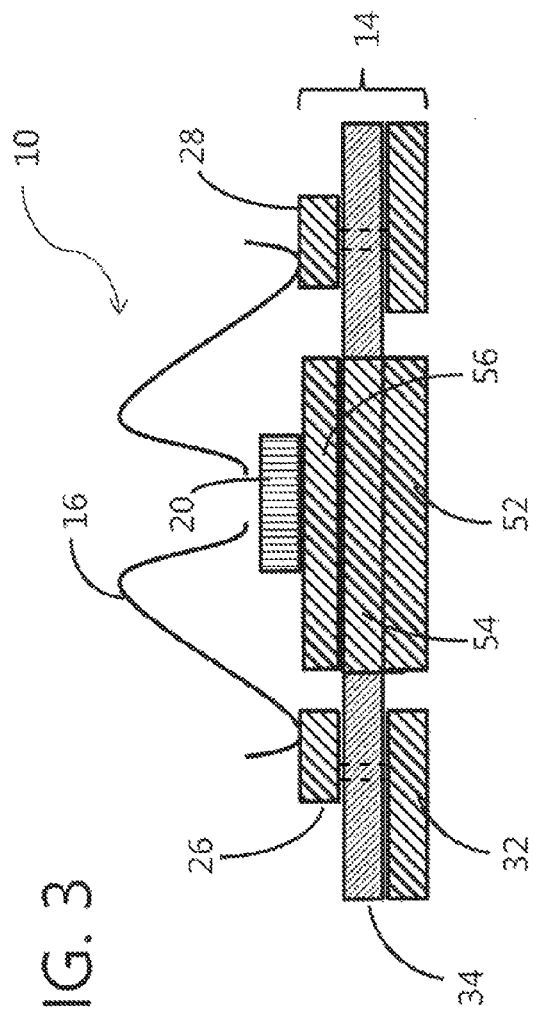

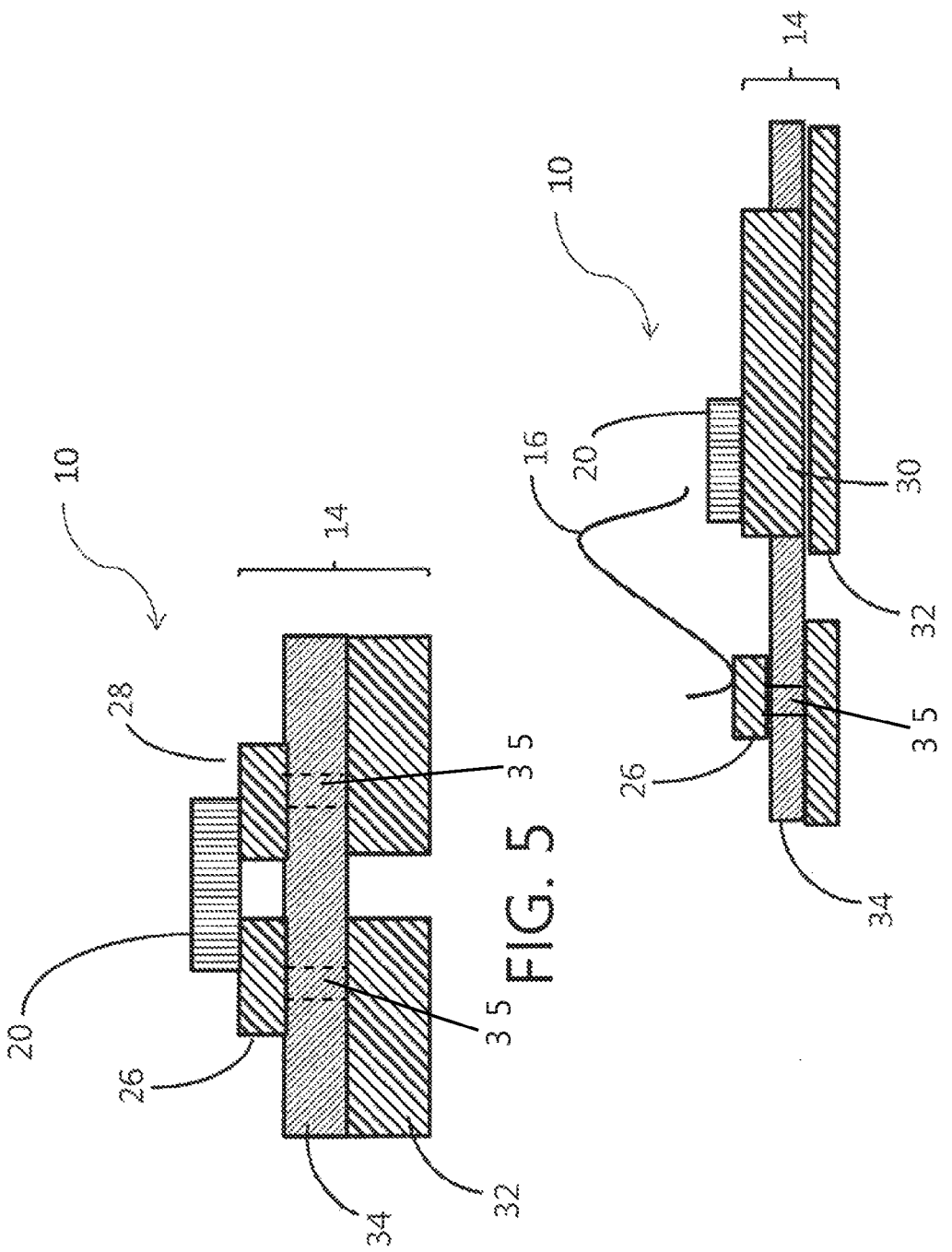

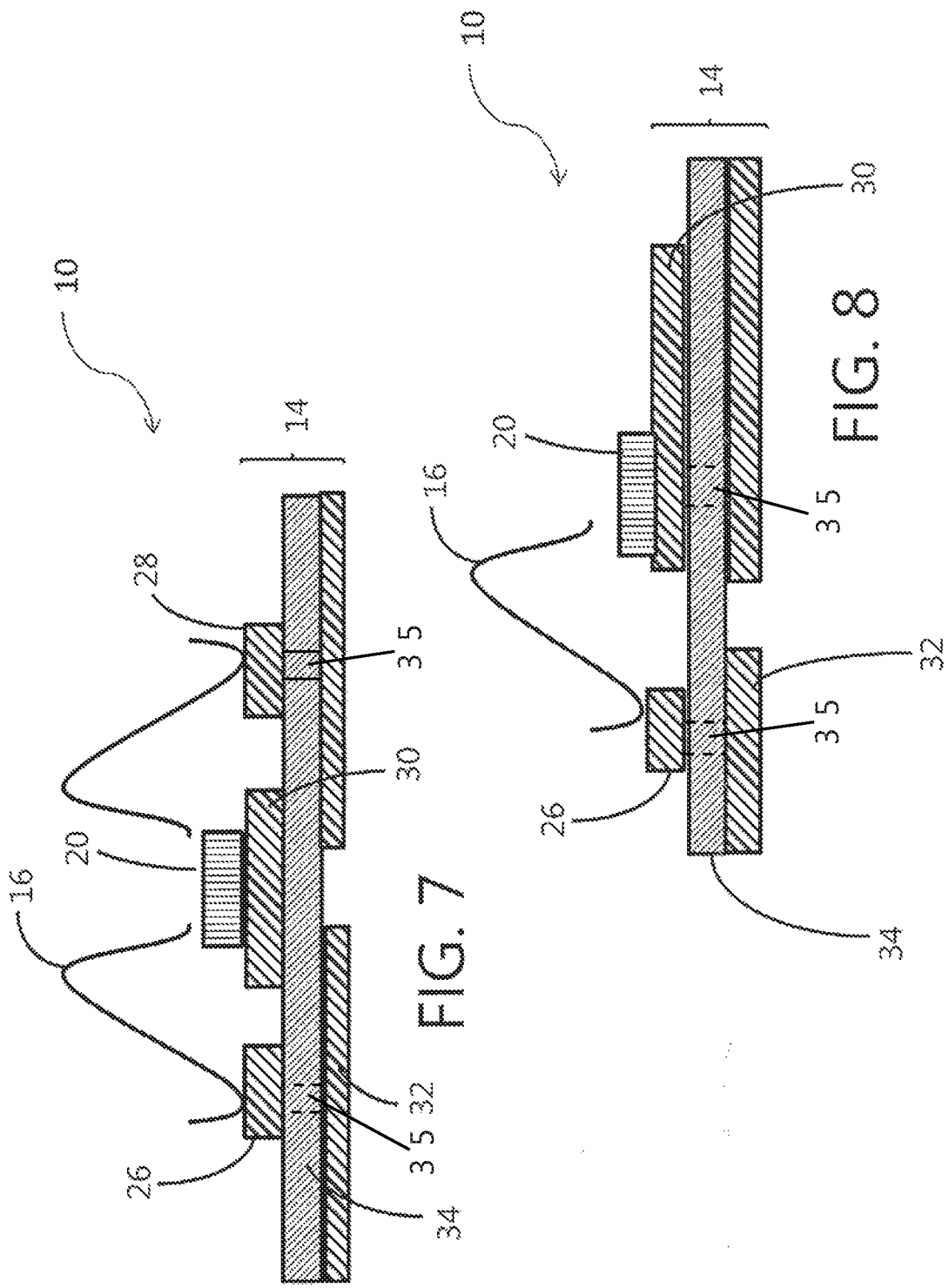

LAMINATE SUB-MOUNTS FOR LED SURFACE MOUNT PACKAGE

CROSS-REFERENCE TO RELATED APPLICATIONS

Not Applicable

FEDERAL SPONSORSHIP

Not Applicable

JOINT RESEARCH AGREEMENT

Not Applicable

TECHNICAL FIELD

This invention pertains generally to light emitting diodes (LED's). More particularly, the invention pertains to an LED having a thin laminate sub-mount that dissipates heat and that may be soldered to an MCPCB using conventional reflow processes or alternatively may be adhered, bolted or otherwise attached to the MCPCB.

BACKGROUND

High output LED's require an electrical current having flow rates sufficient to generate light from the diode. Current LED's typically do not convert all electrical current to light. Instead, a significant amount of the electrical current converts to heat and results in an increased temperature of the diode. Depending upon the amount of heat generated, the heat may be destructive to portions of the micro structure of the LED, leading to the failure of the diode. Although the efficiency of LED's have improved over the years, LED's continue to generate significant amounts of heat compared to the light generated from the supply of electrical current. Thus, a desire to increase the efficiency of light emission from the diode while improving upon the thermal management continues to motivate new designs for LED packages. Over the years, various heat sinks and thermal adhesives have been utilized in an attempt to dissipate heat from the LED. For example, heat sinks on the printed circuit board itself have been used to draw heat away from the diode. These heat sinks on the pcb, however, may not draw a sufficient amount of heat away from LED itself. As electrical currents required to power the LED continue to increase, there is also a need to further enhance thermal management.

SUMMARY

Embodiments according to aspects of the invention provide a thinner, heat dissipating sub-mount for an LED with a coefficient of thermal expansion similar to the printed circuit board on which the sub-mount is mounted. The sub-mount may be manufactured in shapes other than rectangular, may be mounted using conventional reflow processes, or may include bolt holes to mount the sub-mount to the PCB. In accordance with aspects of the invention, an embodiment of the invention includes a sub-mount having a metal layer defining a bottom portion of the sub-mount, a middle dielectric layer, and a top metal layer on which the LED is coupled. The top metal layer is segmented to form conductive pads layered above the first dielectric and a metal core on which the LED is mounted. Vias are formed in the dielectric layer to electrically interconnect the conductive pads with electrically isolated portions of the bottom metal layer. The conductive pads form p and n type electrodes for the LED. The bottom metal layer is treated so that it solders to a PCB or MCPCB using conventional reflow processes. The bottom metal layer has a thickness ranging between 17 microns and 70 microns and the top metal layer has a thickness between 17 microns and 1 mm. The first dielectric layer is made from a ceramic filled polymer.

In accordance with embodiments of the invention, a second dielectric and third metal layer are sandwiched between the top metal layer and lower dielectric layer. An electrically isolated metal core is layered between the top and bottom to support the diode and acts as a heat sink for the submount, drawing heat from the LED and away from the pcb. The metal core may further comprise a multi-layer metal composite and may include an insulating layer sandwiched between the top portion and bottom portion of the sub-mount to further manage the heat dissipation. A reflective coating may be deposited on the top layer to enhance the illumination of the LED.

Also in accordance with aspects of the invention, the ceramic filled polymer includes a polymer selected from the group consisting of epoxies, polyimides, cyanate esters, silicones, phenolics, BT resins, benzocyclobutene, silicone, polyphenylsulfone, polyester, and PEN and a ceramic filler selected from the group consisting of boron nitride, aluminum oxide, aluminum nitride, silicone carbide, silicon nitride, silica, magnesium oxide, zinc oxide, zirconium oxide, and titanium dioxide.

An embodiment of the invention includes a light emitting diode, a metal core supporting the light emitting diode, and layers of the sub-mount surrounding a portion of the metal core. The sub-mount includes a bottom metal layer, middle dielectric layer, and top metal layer. The bottom metal layer has a thickness ranging between 17 microns and 70 microns and the top metal layer has a thickness ranging between 17 microns and 1 mm. The second metal layer is segmented to form conductive pads layered above the middle dielectric layer, wherein a via is formed in the dielectric layer to electrically interconnect the conductive pads with electrically isolated portions of the bottom metal layer. Another dielectric and metal layers may be sandwiched between the top metal layer and the middle dielectric layer to provide additional heat dissipation.

The dielectric layers are made from a ceramic filled polymer that includes a polymer selected from the group consisting of epoxies, polyimides, cyanate esters, silicones, phenolics, BT resins, benzocyclobutene, silicone, polyphenylsulfone, polyester, and PEN and a ceramic filler selected from the group consisting of boron nitride, aluminum oxide, aluminum nitride, silicone carbide, silicon nitride, silica, magnesium oxide, zinc oxide, zirconium oxide, and titanium dioxide.

The accompanying drawings, which are incorporated in and constitute a portion of this specification, illustrate embodiments of the invention and, together with the detailed description, serve to further explain the invention. The embodiments illustrated herein are presently preferred; however, it should be understood, that the invention is not limited to the precise arrangements and instrumentalities shown. For a fuller understanding of the nature and advantages of the invention, reference should be made to the detailed description in conjunction with the accompanying drawings.

DESCRIPTION OF THE DRAWINGS

In the various figures, which are not necessarily drawn to scale, like numerals throughout the figures identify substantially similar components.

FIG. 1 is a partial sectional view of an LED package in accordance with an embodiment of the invention;

FIG. 2 is a partial sectional view of an LED package in accordance with an embodiment of the invention;

FIG. 3 is a partial sectional view of an LED package in accordance with an embodiment of the invention;

FIG. 4 is a partial sectional view of an LED package in accordance with an embodiment of the invention;

FIG. 5 is a partial sectional view of an LED package in accordance with an embodiment of the invention;

FIG. 6 is a partial sectional view of an LED package in accordance with an embodiment of the invention;

FIG. 7 is a partial sectional view of an LED package in accordance with an embodiment of the invention; and FIG. 8 is a partial sectional view of an LED package in accordance with an embodiment of the invention.

DETAILED DESCRIPTION

The following description provides detail of various embodiments of the invention, one or more examples of which are set forth below. Each of these embodiments are provided by way of explanation of the invention, and not intended to be a limitation of the invention. Further, those skilled in the art will appreciate that various modifications and variations may be made in the present invention without departing from the scope or spirit of the invention. By way of example, those skilled in the art will recognize that features illustrated or described as part of one embodiment, may be used in another embodiment to yield a still further embodiment. Thus, it is intended that the present invention also cover such modifications and variations that come within the scope of the appended claims and their equivalents.

The LED packaging 10 of the present invention includes a thin metal substrate that replaces the thicker conventional ceramic substrate sub-mounts. The metal used in the sub-mount may comprise Cu, for example, that includes a coefficient of thermal expansion that more closely matches the coefficient of thermal expansion of the MCPCB or PCB. Matching the coefficient of thermal expansion of the sub-mount and the MCPCB or PCB improves reliability and stability of the solder joints between the sub-mount and MCPCB. Embodiments of the invention include a Cu substrate having a thickness ranging between 17 microns and 70 microns thick. The remaining portion of the sub-mount is layered on top of the substrate and the bottom surface of the substrate is treated so that it can be soldered to a PCB or MCPCB using known reflow processes.

A low thermal resistance dielectric layer is deposited on the substrate using known deposition techniques. The dielectric layer may have thickness ranging between 10 microns and 200 microns and a corresponding thermal resistance dependent upon the thickness of the dielectric layer. The dielectric layer preferably comprises a ceramic filled polymer. Without limitation intended, the polymers may be selected from the group consisting of epoxies, polyimides, cyanate esters, silicones, phenolics, BT resins, benzocyclobutene, silicone, polyphenylsulfone, polyester, and PEN. Additionally, without limitation intended, the ceramic filler may be selected from the group consisting of boron nitride, aluminum oxide, aluminum nitride, silicone carbide, silicon nitride, silica, magnesium oxide, zinc oxide, zirconium oxide, and titanium dioxide. Volume fractions of the ceramic filler can range between 0-80% v/v but preferably will range between 40-65% v/v. An additional top layer of copper is deposited onto the dielectric. This Cu layer may be patterned to isolate contact pads and a core on which the LED built.

Various embodiments of the invention will be described in detail in connection with the corresponding Figures. Referring first to FIG. 1, the LED package 10 includes a sub-mount 14, LED 20 and electrical leads 16. The sub-mount 14 includes a bottom layer or substrate 32 of copper onto which is layered a first dielectric layer 38. A middle layer 36 of CU is deposited or layered above the first dielectric 38 and a second dielectric 34 is layered above the middle Cu layer. A top metal layer of Cu is layered above the dielectric 34. The top metal layer is patterned to isolate conductive pads or electrodes 26 and 28. Additionally, a reflective layer 40 may be layered or deposited above the top layer of copper. The reflective layer is made of known suitable materials have a reflectance in the visible spectrum of greater than 85% with a reflectance greater than 90% being preferred. Prior to depositing and patterning the top layer of copper, the second dielectric layer may be patterned to form cavities into which the copper deposits. In this manner a via 35 of known suitable construction may be formed to interconnect the conductive pad 26 and middle copper layer 36, however the conductive pad 28 is electrical conductive with the middle layer 36. Further, a thermally conductive core 50 is formed by metal layers 36, 54 and 56. The LED 20 is positioned above the metal core and heat from the LED dissipates through the metal layers. Electrical leads 16 electrically interconnect the LED 20 with the conductive pads 26 and 28. The substrate may also be patterned to electrically isolate the layer and electrically align portions of the substrate with the conductive pads 26 and 28. Core layer 52 of the metal substrate aligns with the core 50.

FIG. 2 illustrates the LED package 10 having a sub-mount 14, LED 20 and electrical leads 16 wherein both conductive pads 26 and 28 require vias 35 of known suitable construction to electrically interconnect the electrical pads with the middle and lower metal layers 36 and 32. The sub-mount 14 includes a bottom layer or substrate 32 of copper onto which is layered a first dielectric layer 38. A middle layer 36 of CU is deposited or layered above the first dielectric 38 and a second dielectric 34 is layered above the middle Cu layer. A top metal layer of Cu is layered above the dielectric 34. The top metal layer is patterned to isolate conductive pads or electrodes 26 and 28. Additionally, a reflective layer 40 may be layered or deposited above the top layer of copper. A thermally conductive core 50 is formed by metal layers 36, 54 and 56. The LED 20 is positioned above the metal core and heat from the LED dissipates through the metal layers. Electrical leads 16 electrically interconnect the LED 20 with the conductive pads 26 and 28. Core layer 52 of the metal substrate aligns with the core 50.

FIG. 3 illustrates an embodiment of the LED package 10 including a sub-mount 14, LED 20 and electrical leads 16 wherein the metal core supporting the LED extends from the bottom surface of the substrate to the top metal surface underlying the LED. Similar to other embodiments, the sub-mount 14 includes a bottom layer or substrate 32 of copper onto which is layered a first dielectric layer 38. A middle layer 36 of CU is deposited or layered above the first dielectric 38 and a second dielectric 34 is layered above the middle Cu layer. A top metal layer of Cu is layered above the dielectric 34. The top metal layer is patterned to isolate conductive pads or electrodes 26 and 28. Additionally, a reflective layer 40 may be layered or deposited above the top layer of copper. A thermally conductive core 50 is formed by metal layers 36, 52, 54 and 56. The LED 20 is positioned above this metal core and heat from the LED dissipates through the metal layers to the bottom and outwards through metal layer 36. Electrical leads 16 electrically interconnect the LED 20 with the conductive pads 26 and 28.

FIG. 4 illustrates an embodiment of the LED package 10 including a sub-mount 14, LED 20 and electrical leads 16 wherein the metal core supporting the LED extends from the bottom surface of the substrate to the top metal surface underlying the LED. Similar to other embodiments, the sub-mount 14 includes a bottom layer or substrate 32 of copper onto which is layered a first dielectric layer 34. The top metal layer is deposited above the dielectric layer 34 and patterned to isolate conductive pads or electrodes 26 and 28. A thermally conductive core 50 is formed by metal layers 52, 54 and 56. The LED 20 is positioned above this metal core and heat from the LED dissipates through the metal layers to the bottom and outwards through metal layer 36. Electrical leads 16 electrically interconnect the LED 20 with the conductive pads 26 and 28.

FIG. 5 illustrates an embodiment of the LED package 10 including a sub-mount 14 and LED 20 wherein the LED is supported by and electrically coupled to conductive pads 26 and 28. Similar to other embodiments, the sub-mount 14 includes a bottom layer or substrate 32 of copper onto which is layered a first dielectric layer 34. The top metal layer is deposited above the dielectric layer 34 and patterned to isolate conductive pads or electrodes 26 and 28. Vias 35 of known suitable construction extend through the dielectric layer 34 to electrically connect isolated portions of the top and bottom metal layers.

FIG. 6 illustrates an embodiment of the LED package 10 including a sub-mount 14, LED 20 and one electrical leads 16 wherein a metal core (layers 32 and 30) extends from the bottom surface of the substrate to the top metal surface underlying the LED, both supporting the LED and proving a first electrode for the LED. Similar to other embodiments, the sub-mount 14 includes a bottom layer or substrate 32 of copper onto which is layered a first dielectric layer 34. The dielectric is patterned to define a portion of the core. The top metal layer 30 is deposited into the patterned cavity of the dielectric and above the dielectric layer 34. The top layer is further patterned to define the electrode 26. The LED 20 is positioned above the metal core 30 and 32 and heat from the LED dissipates through the metal layers to the bottom of the sub-mount 14. A via 35 of known suitable construction is formed in dielectric 34 to electrically interconnect and isolate a portion of the substrate 32 and electrical connector pad 26.

FIG. 7 illustrates the LED package 10 having a sub-mount 14, LED 20 and electrical leads 16 wherein both conductive pads 26 and 28 require vias 35 of known suitable construction to electrically interconnect the electrical pads with the lower metal layer 32. The sub-mount 14 includes a bottom layer or substrate 32 of copper onto which is layered a first dielectric layer 34. A top metal layer of Cu is layered above the dielectric 34. The top metal layer is patterned to isolate conductive pads or electrodes 26 and 28. The top layer is also patterned to isolate a thermally conductive core 30. The LED 20 is positioned above the metal core 30 and heat from the LED dissipates through the metal layer 30. Electrical leads 16 electrically interconnect the LED 20 with the conductive pads 26 and 28.

FIG. 8 illustrates an embodiment of the LED package 10 including a sub-mount 14, LED 20 and one electrical leads 16 wherein a metal core (layer 30) supports the LED and provides a thermal pad for the LED. Similar to other embodiments, the sub-mount 14 includes a bottom layer or substrate 32 of copper onto which is layered a first dielectric layer 34. The top metal layer is deposited onto the dielectric layer 34. The top layer is further patterned to define the electrode 26 and thermal pad or core 30. The LED 20 is positioned above the metal core 30 and heat from the LED dissipates through the metal layer. Vias 35 of known suitable construction are formed in dielectric 34 to electrically interconnect an isolated portion of the substrate 32 and electrical connector pad 26 and an isolated portion of the substrate 32 and the core 30.

These and various other aspects and features of the invention are described with the intent to be illustrative, and not restrictive. This invention has been described herein with detail in order to comply with the patent statutes and to provide those skilled in the art with information needed to apply the novel principles and to construct and use such specialized components as are required. It is to be understood, however, that the invention can be carried out by specifically different constructions, and that various modifications, both as to the construction and operating procedures, can be accomplished without departing from the scope of the invention. Further, in the appended claims, the transitional terms comprising and including are used in the open ended sense in that elements in addition to those enumerated may also be present. Other examples will be apparent to those of skill in the art upon reviewing this document.

What is claimed is:

1. A light emitting diode package comprising:
   a light emitting diode;
   a metal core having a top portion supporting said light emitting diode; and
   a laminate sub-mount surrounding a portion of said metal core, said sub-mount including:
   a first metal layer defining a bottom portion of said sub-mount and having a thickness between 17 microns and 70 microns;
   a first dielectric layer made from a ceramic filled polymer and positioned above said first metal layer;
   a second metal layer positioned above said first dielectric layer and defining a top portion of said sub-mount, said second metal layer having a thickness between 17 microns and 1 mm;
   wherein said second metal layer is segmented to form conductive pads layered above said first dielectric, and wherein a via is formed in said first dielectric layer to electrically interconnect said conductive pads with electrically isolated portions of said first metal layer; and
   wherein a bottom portion of said first metal layer is aligned with a bottom of said metal core.

2. The diode package as recited in claim 1, further including a second dielectric and third metal layer sandwiched between said second metal layer and said first dielectric layer.

3. The diode package as recited in claim 1, wherein said ceramic filled polymer includes a polymer selected from the group consisting of epoxies, polyimides, cyanate esters, silicones, phenolics, BT resins, benzocyclobutene, silicone, polyphenylsulfone, polyester, and PEN.

4. The diode package as recited in claim 1, wherein said ceramic filled polymer includes a ceramic filler selected from the group consisting of boron nitride, aluminum oxide, aluminum nitride, silicone carbide, silicon nitride, silica, magnesium oxide, zinc oxide, zirconium oxide, and titanium dioxide.

5. The diode package as recited in claim 1, wherein said metal core extends between said top portion and bottom portion of said sub-mount.

6. The diode package as recited in claim 5, wherein said metal core includes a multi-layer metal composite.

7. The diode package as recited in claim 6, wherein said metal core includes an insulating layer sandwiched between a top layer and bottom layer of said metal core.

8. The diode package as recited in claim 1, further including a reflective coating layered above said second metal layer.

* * * * *